(12) United States Patent
Lin et al.

(10) Patent No.: US 7,560,365 B2
(45) Date of Patent: Jul. 14, 2009

(54) METHOD OF SEMICONDUCTOR THIN FILM CRYSTALLIZATION AND SEMICONDUCTOR DEVICE FABRICATION

(75) Inventors: Jia-Xing Lin, Hsinchu (TW); Chi-Lin Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 233 days.

(21) Appl. No.: 11/226,679

(22) Filed: Sep. 14, 2005

(65) Prior Publication Data

US 2007/0054473 A1    Mar. 8, 2007

(51) Int. Cl.
*H01L 21/36* (2006.01)
*H01L 21/20* (2006.01)

(52) U.S. Cl. .............................. 438/487; 257/E21.133; 257/E21.134; 438/166

(58) Field of Classification Search ................ 438/166, 438/487; 257/E21.133, E21.134
See application file for complete search history.

(56) References Cited

U.S. PATENT DOCUMENTS

| 4,870,031 A | * | 9/1989 | Sugahara et al. ............ 438/479 |
| 2004/0053452 A1 | * | 3/2004 | Hasegawa et al. ........... 438/151 |
| 2006/0060848 A1 | * | 3/2006 | Chang et al. .................. 257/52 |

* cited by examiner

*Primary Examiner*—Asok K Sarkar
(74) *Attorney, Agent, or Firm*—Alston & Bird LLP

(57) ABSTRACT

A method for fabricating a semiconductor device includes providing a substrate, forming an amorphous silicon layer over the substrate, forming a heat retaining layer on the amorphous silicon layer, patterning the heat retaining layer, and irradiating the patterned heat retaining layer.

15 Claims, 6 Drawing Sheets

METHOD OF SEMICONDUCTOR THIN FILM CRYSTALLIZATION AND SEMICONDUCTOR DEVICE FABRICATION

BACKGROUND OF THE INVENTION

The present invention relates generally to semiconductor manufacturing, and more particularly, to a method of manufacturing a semiconductor device by crystallizing an amorphous silicon film through the use of a heat retaining layer.

The demand for smaller electronic products with higher resolution displays spurs continued research and development in the area of liquid crystal displays (LCDs). An important component of an LCD is a thin film transistor ("TFT"). TFTs typically are fabricated on a transparent substrate such as glass or plastic, and employ a thin film silicon semiconductor.

Thin film silicon semiconductors typically include amorphous silicon (a-Si) semiconductors and polycrystalline silicon (p-Si) semiconductors. Amorphous silicon semiconductors are most commonly used because they can be fabricated relatively inexpensively through mass production. P—Si semiconductors have superior physical properties, such as electrical conductivity, when compared to a-Si semiconductors. P—Si semiconductors, however, are more difficult to produce than a-Si semiconductors. Due to the superior properties of p-Si semiconductors, much research has been focused on improving the process of fabricating p-Si semiconductors.

A method for manufacturing a p-Si TFT LCD includes a process of crystallization. The process includes forming an a-Si thin film on a glass substrate, and forming the thin film into a p-Si film. Examples of conventional methods of crystallization include a solid phase crystallization ("SPC") method and an excimer laser annealing ("ELA") method. These methods use low thermal budgets, i.e., high temperatures and short annealing times for the ELA method, or relatively low temperatures with longer annealing times for the SPC method. The low thermal budget process is important because glass substrates typically used in LCDs cannot withstand high annealing temperatures and/or long annealing times without deforming or breaking. For example, glass typically breaks or deforms at temperatures of approximately 600° C. (the highest temperatures typically allowed without deforming the glass substrate).

The SPC method includes annealing the a-Si film formed on the glass substrate at a temperature of approximately 400° C. to 800° C. so as to obtain a p-Si film. Since the SPC method may involve the use of a high-temperature process, it is necessary to use an expensive quartz glass in the glass substrate, typically is cost prohibitive for use in LCD devices.

The ELA method includes irradiating the a-Si film with a short-pulse excimer laser having a pulse width of about 20 to 200 ns so as to obtain the p-Si film. The ELA method is currently the most commonly used method in polycrystalline silicon TFT fabrication. The grain size of p-Si thin film can reach 300 to 600 nm, and the carrier mobility of p-Si TFTs can reach 200 $cm^2/V$-s. However, this value is yet not sufficient for future demand of high-performance flat panel displays. Furthermore, unstable laser energy output of ELA narrows down the process window, generally to a level of several tens of $mJ/cm^2$. Therefore, frequently repeated laser irradiation is necessary to re-melt imperfect fine grains caused by the irregular laser energy fluctuation, which renders the ELA method cost-ineffective and in turn less competitive.

In the p-Si TFT LCD, either manufactured by the SPC method or the ELA method, there has been a stronger demand for further enlargement of the crystal grain size of the p-Si film. In the conventional methods, the grain size is approximately 300 to 600 nm. To enhance capability of the p-Si TFT LCD, it may be necessary to enlarge the grain size to several micrometers or more. Reasons for the enlargement of the crystal grain size are described below. There is a numeric value of mobility as a factor which influences the capability of a semiconductor device. The mobility represents an electron drift velocity. The drift velocity drops when the grain size is small, and there are many crystal grain fields in a path of the electron. When the drift velocity decreases, the enhanced capability of the semiconductor device cannot be expected.

A technique called super lateral growth ("SLG") has been known to form crystal grains of larger grain size, as compared to the crystal grain size via conventional excimer laser crystallization. Although a relatively large crystal grain can be obtained, the energy intensity area of a laser beam, where the SLG is obtained, is much higher than the intensity that is used in ordinary excimer laser crystallization. Also, the range of the energy intensity area is extremely narrow. From the viewpoint of the position control of the crystal grain, it may be impossible to control the position where a large crystal grain is obtained. Consequently, the size of the crystal grains is not even and the roughness of the crystal surface is extremely large.

A Sequential Lateral Solidification ("SLS") method therefore has been developed to control artificially the SLG to be taken place at a desired position. According to the SLS method, an excimer laser beam of pulse oscillation is irradiated to a material via a slit-like mask. The crystallization is carried out while the relative position between the material and the laser beam is displaced, at every shot, by a distance which is roughly equivalent to the length of the crystal formed via the SLG. However, the SLS method may suffer from an insufficient throughput due to a relatively small feed pitch, i.e., the relative shift distance, of the laser beam between the beam spot on the material surface and the material substrate.

It is therefore desirable to have a method of semiconductor thin film crystallization that can achieve higher throughput and greater, uniform grain size in a cost efficient manner without compromising desired electrical properties.

BRIEF SUMMARY OF THE INVENTION

The present invention is directed to a method that obviates one or more problems resulting from the limitations and disadvantages of the prior art.

In accordance with an embodiment of the present invention, there is provided a method for fabricating a semiconductor device that comprises providing a substrate, forming an amorphous silicon layer over the substrate, forming a heat retaining layer on the amorphous silicon layer, patterning the heat retaining layer, and irradiating the patterned heat retaining layer.

Also in accordance with the present invention, there is provided a method for fabricating a semiconductor device that comprises providing a substrate, forming a buffer layer on the substrate, forming an amorphous silicon layer on the buffer layer, forming a heat retaining layer on the amorphous silicon layer, patterning the heat retaining layer, and irradiating the amorphous silicon layer and the patterned heat retaining layer with a laser.

Further in accordance with the present invention, there is provided a method of fabricating a semiconductor device that comprises forming an amorphous silicon layer over a substrate, forming a heat retaining layer on the amorphous silicon layer, patterning the heat retaining layer, and irradiating the amorphous silicon layer and the heat retaining layer.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

Reference will now be made in detail to the present embodiment of the invention, an example of which is illustrated in the accompanying drawings. Wherever possible, the same reference numbers are used throughout the drawings to refer to the same or like parts.

In the drawings:

FIGS. 1A to 1G are diagrams showing a method for fabricating a semiconductor device in accordance with one embodiment of the present invention;

FIG. 2 is a schematic diagram of an active layer formed in accordance with the method illustrated in FIGS. 1A to 1G; and FIGS. 3A and 3B are schematic diagrams of a single-gate structure and a dual-gate structure, respectively.

DETAILED DESCRIPTION OF THE INVENTION

Figure 1A:
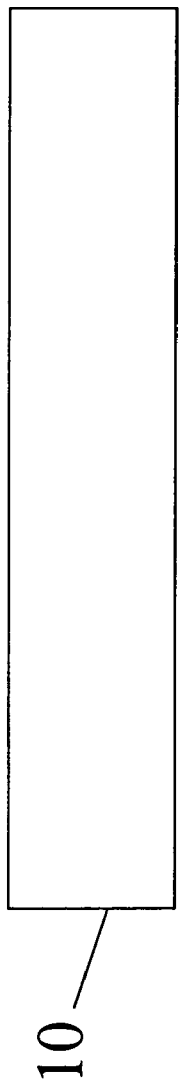

FIGS. 1A to 1G are diagrams showing a method for fabricating a semiconductor device in accordance with one embodiment of the present invention. Referring to FIG. 1A, a substrate 10 is defined, for example, by rinsing and drying. Substrate 10 includes one of a semiconductor wafer, quartz, glass, plastic or metal foil. The thickness of substrate 10 may vary as the material varies. In one aspect, substrate 10 has a thickness of approximately 0.525 millimeter (mm) for a 4-inch semiconductor wafer, or 0.625 mm for an 8-inch semiconductor wafer. In other aspects, substrate 10 made of glass, plastic or metal foil has a thickness of approximately 0.5, 0.2 and 0.05 mm, respectively.

Figure 1B:
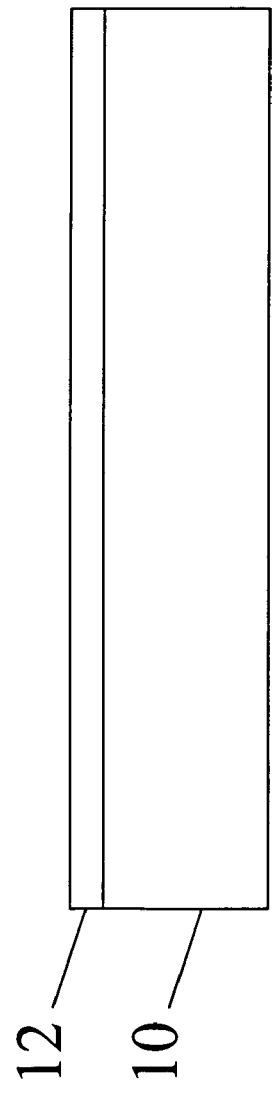

Referring to FIG. 1B, a buffer layer 12 is optionally formed on substrate 10. Buffer layer 12, for example, a silicon dioxide ($SiO_2$) layer, functions to prevent metal ions in substrate 10 from contaminating subsequent layers formed over substrate 10. Buffer layer 12 has a thickness of approximately 3000 angstroms.

Figure 1C:
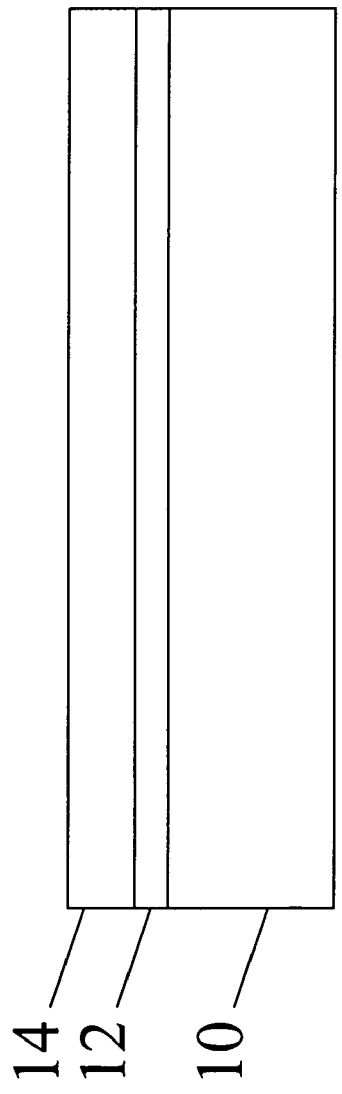

Next, referring to FIG. 1C, a semiconductor precursor layer 14 is formed on buffer layer 12 by, for example, chemical vapor deposition ("CVD"). In one embodiment according to the present invention, semiconductor precursor layer 14 includes amorphous silicon, having a thickness of approximately 500 angstroms.

Figure 1D:
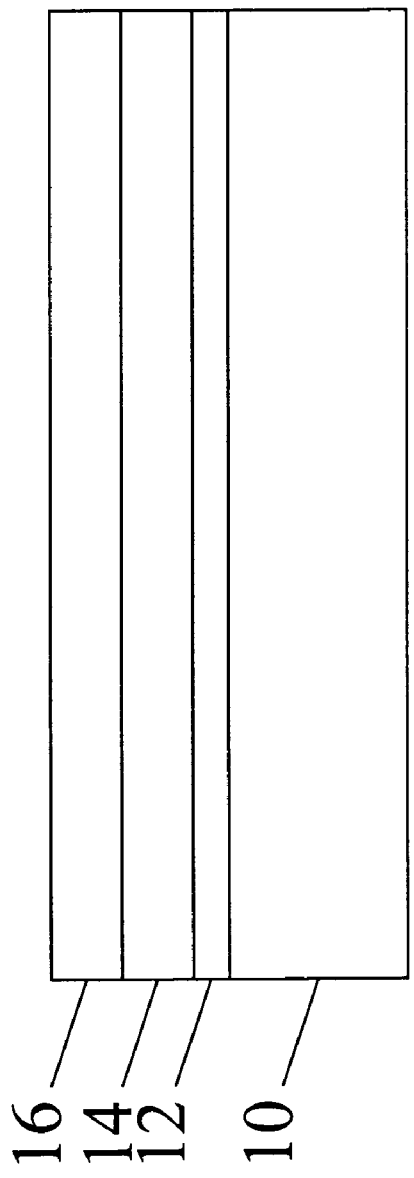

Referring to FIG. 1D, a heat retaining layer 16 is formed on semiconductor precursor layer 14 by, for example, CVD. Heat retaining layer 16 is made of a material that absorbs a portion of an irradiating beam and transmits. In one embodiment according to the present invention, heat retaining layer 16 includes silicon oxynitride ($SiO_xN_y$), x and y being suitable integers, which absorbs 30% of an irradiating beam. Heat retaining layer 16 has a thickness of approximately 2000 to 5000 angstroms.

Figure 1E:
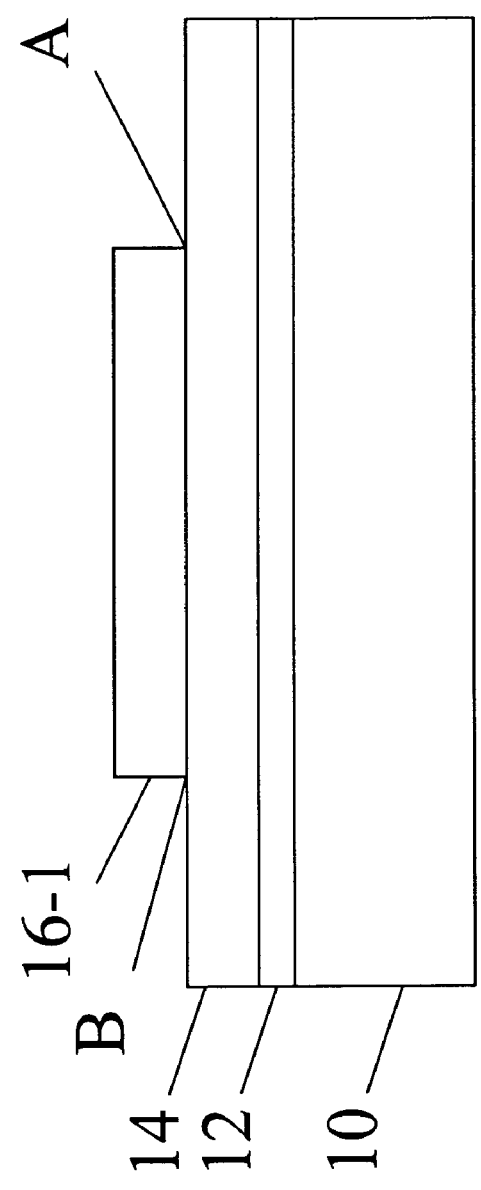

Referring to FIG. 1E, heat retaining layer 16 is defined by, for example, a patterning and etching process, which determines initial growth sites A and B on amorphous silicon layer 14. A defined heat retaining layer 16-1 functions to serve as a mask to control the size of an active region of a TFT. Specifically, a portion of amorphous silicon layer 14 between the sites A and B underlying the defined heat retaining layer 16 later becomes an active region of a transistor. Furthermore, defined heat retaining layer 16-1 also functions to control a grain boundary formed in amorphous silicon layer 14, as will be described later.

Figure 1F:
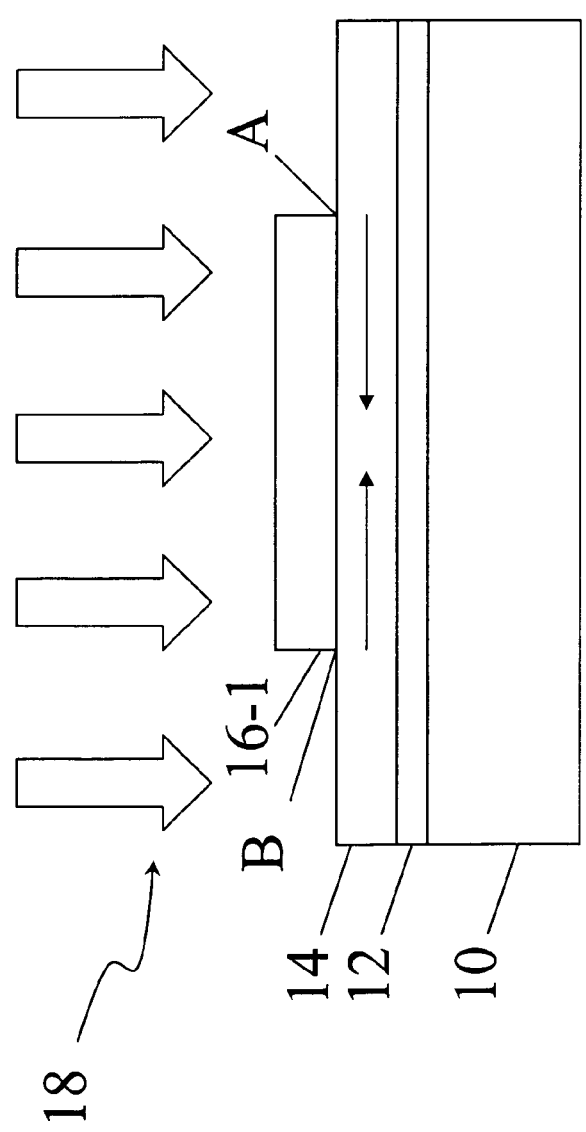

In order to heat amorphous silicon layer 14 at a high temperature and simultaneously prevent substrate 10 from damage, a laser annealing process which generates laser beams for a short period in a pulsed manner is used. Referring to FIG. 1F, amorphous silicon layer 14 and defined heat retaining layer 16-1 are exposed to a laser 18. Among the laser beams described above, in particular, frequency doubled Nd:YAG laser beams or excimer laser beams, such as xenon chloride (XeCl) laser beams with a wavelength of approximately 308 nm, xenon fluoride (XeF) laser beams with a wavelength of 351 nm and krypton fluoride (KrF) laser beams with a wavelength of approximately 248 nm are suitable. The laser annealing is carried out in such a manner that laser 18 is processed by means of an optical system (not shown) so as to be shaped into a spot-like form or a linear form at a surface to be irradiated. The surface to be irradiated over substrate 10 is scanned by laser 18. That is, an irradiation position of the laser beam is shifted with respect to the surface to be irradiated. Thereafter, the irradiation with the laser beam and the stepwise movement of substrate 10 are repeated until amorphous silicon layer 14 underlying defined heat retaining layer 16-1 is poly-crystallized.

In one embodiment according to the present invention, a short pulse of energy having a beam diameter of 20 μm is irradiated at 20 shots per second. Laser 18 moves with respect to amorphous silicon layer 14 and defined heat retaining layer 16-1 with an irradiation position overlap of approximately 0.2 μm, or 1% of the beam diameter. As compared to conventional techniques having an irradiation position overlap ranging from approximately 50% to 95%, the 1% overlap in accordance with the present invention does greatly help improve the throughput.

Laser 18 provides the necessary energy to result in melting of amorphous silicon layer 14 underlying defined heat retaining layer 16-1. Crystalline growth commences from the initial growth sites A and B via super lateral growth. In the super lateral growth, a portion where a semiconductor is melted completely due to the irradiation of a laser beam, and a portion where the solid-phase semiconductor area remains, are formed, and then, the crystal growth begins around the solid-phase semiconductor area as the crystal nucleus. Since it takes a certain period of time for nucleation to take place in the completely melted area, during the period of time until the nucleation takes place in the completely melted area, the crystal grows around the above-described solid-phase semiconductor area as the crystal nucleus in the horizontal or lateral direction with respect to the film surface of the above-described semiconductor. Therefore, the crystal grain grows up to a length as long as several tens of times of the film thickness. The phenomenon is referred to as a controlled super lateral growth ("C-SLG").

Figure 1G:
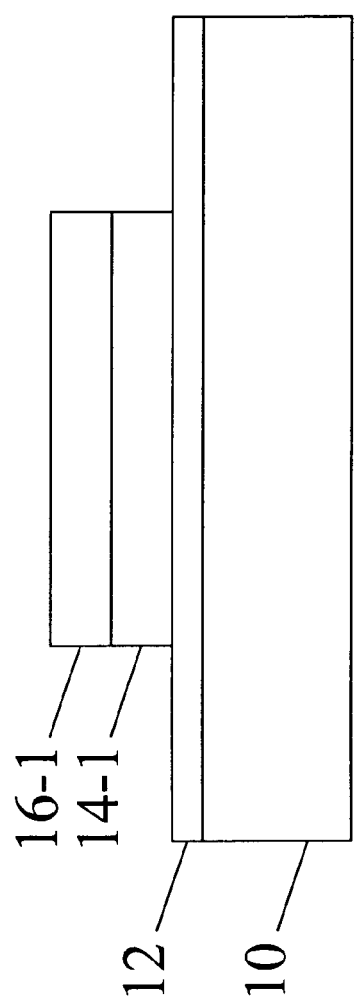

Next, referring to FIG. 1G, the other portion of amorphous silicon layer 14 not covered by defined heat retaining layer 16-1 is etched away. Defined heat retaining layer 16-1 functions to serve as a mask in the etching process, and therefore no additional masks are required. The remaining amorphous silicon layer 14-1 after the etching later becomes an active layer for a TFT.

Figure 2:
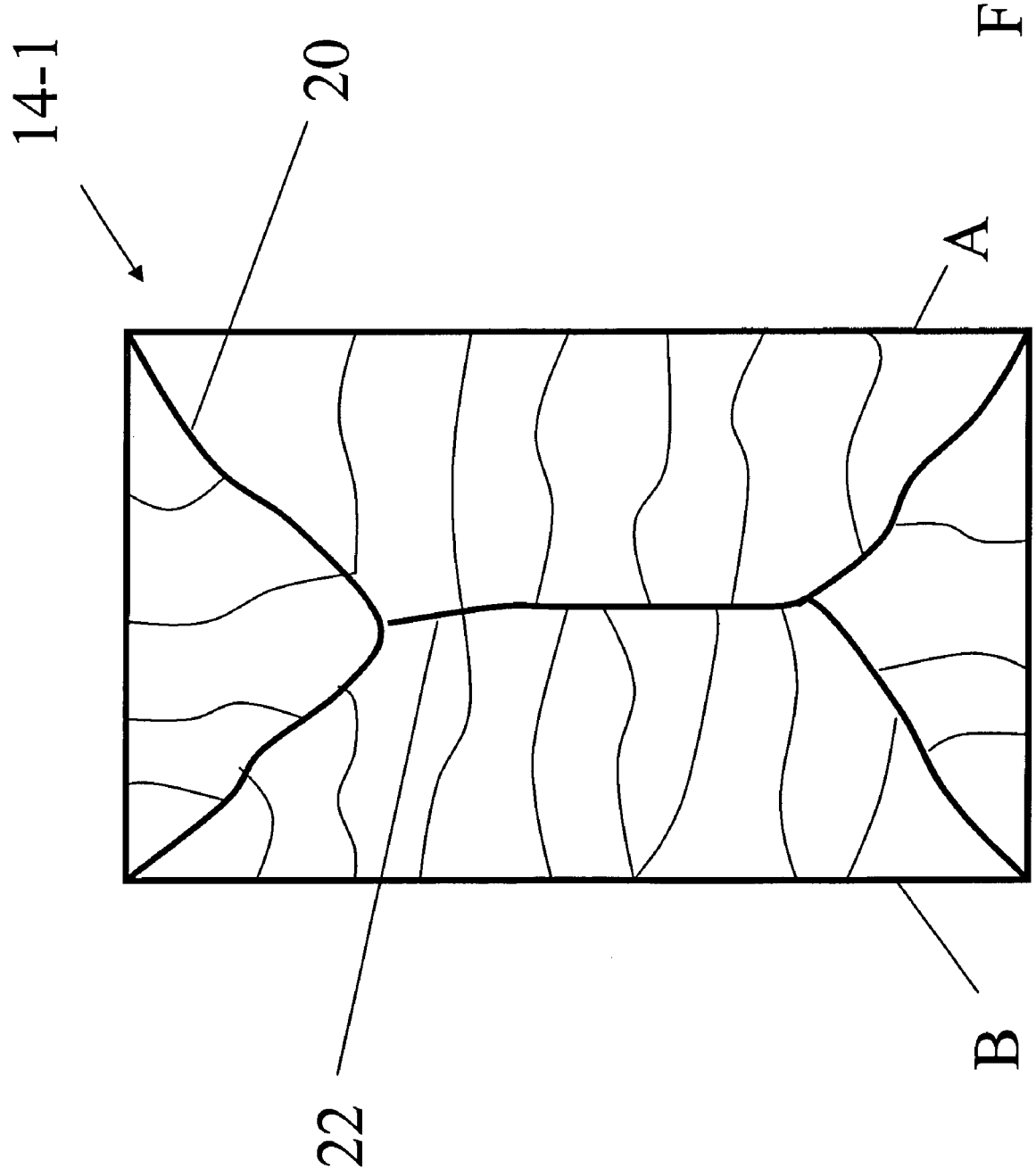

FIG. 2 is a schematic diagram of an active layer 14-1 formed in accordance with the method illustrated in FIGS. 1A to 1G. Referring to FIG. 2, grain boundaries 20 and 22 are formed in active layer 14-1 during the crystal growth. In particular, a vertical grain boundary 22 extending in parallel with the initial growth site A or B is expected to be formed at a center region between the sites A and B. A grain boundary of a crystal grain refers to an area where the translational symmetry of the crystal is decayed. It is known that, due to the influence of the recombination center or trapping center of the carrier, or the influence of the potential barrier in the crystal grain boundary caused from the crystal defect or the like, the current transport characteristics of the carrier is decreased. For example, vertical grain boundary 22 may adversely affect the mobility of carriers, which move across the center region during current transport.

Figure 3A:
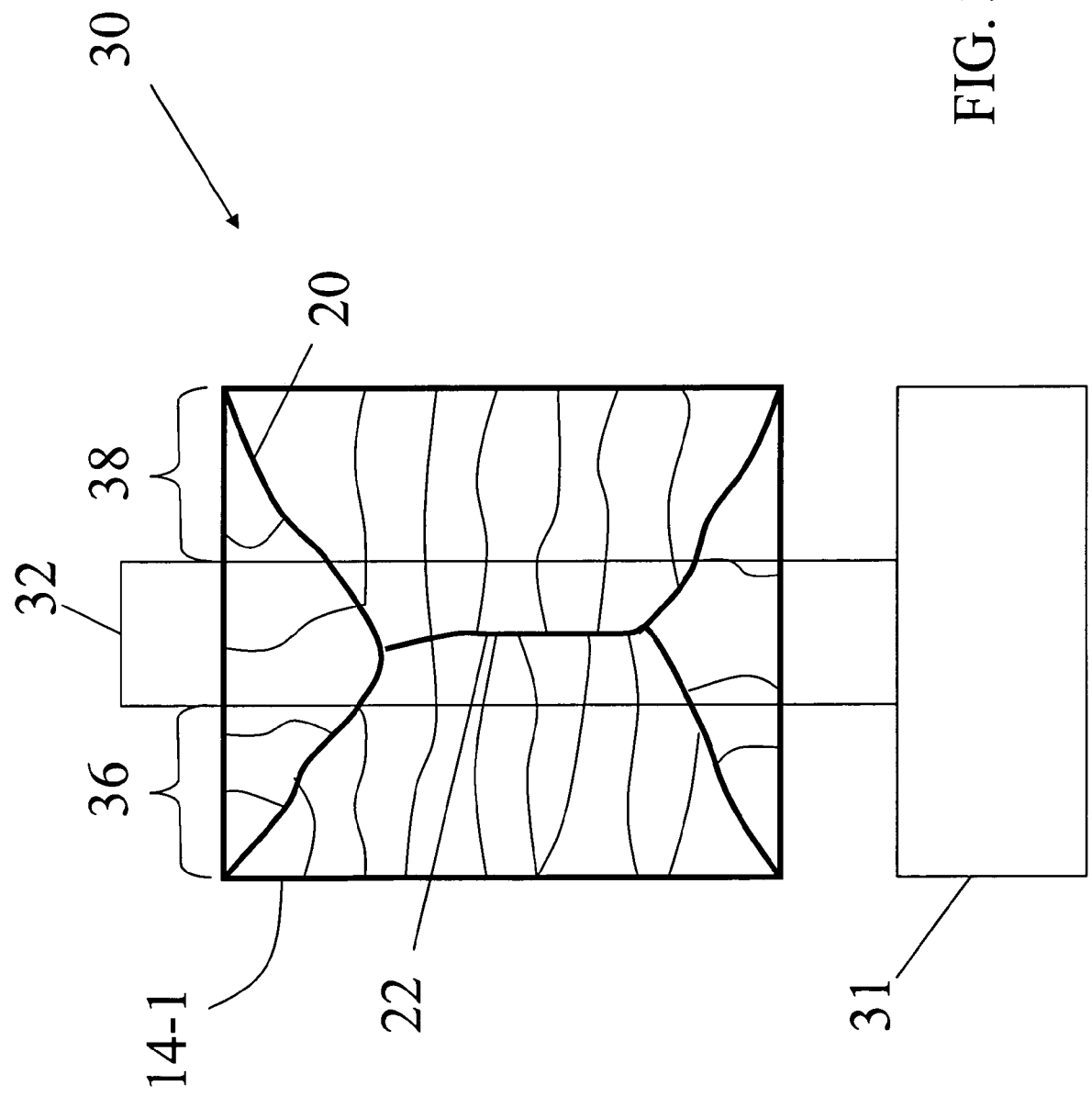
Figure 3B:
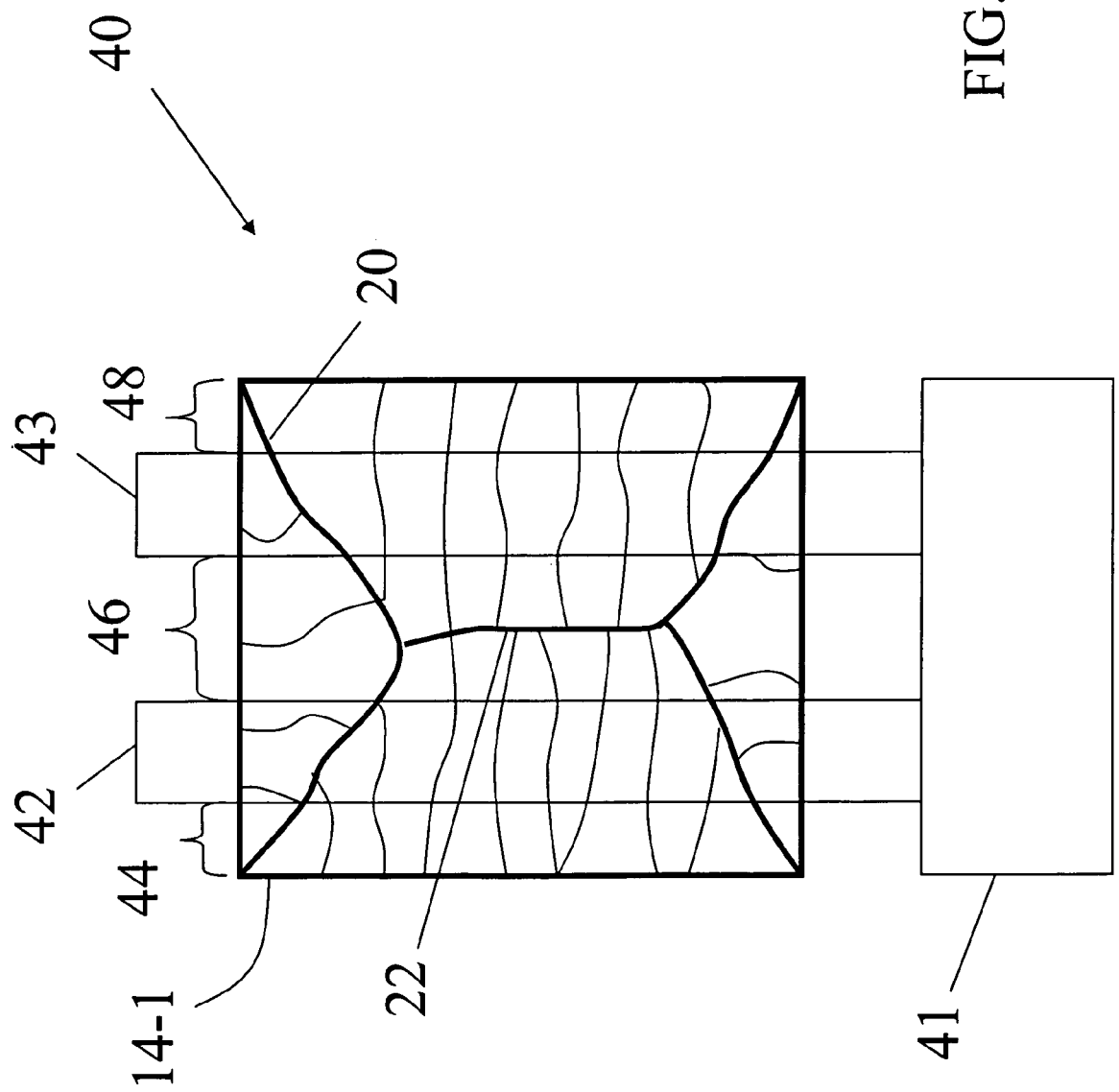

FIGS. 3A and 3B are schematic diagrams of a single-gate structure 30 and a dual-gate structure 40, respectively. Referring to FIG. 3A, single-gate structure 30 includes a gate 31, a gate finger 32 and an active layer 14-1. After heat retaining layer 16-1 used to determine active layer 14-1 is removed, active layer 14-1 is ion-implanted by, for example, negative-type ions and then annealed by thermal cycles to form heavily n-doped (n+) layers. The ion implant is blocked by gate finger 32. Within active layer 14-1, a channel region (not numbered) under gate finger 32 is formed. The channel region separates a first diffused region 36, for example, a source region, from a second diffused region 38, for example, a drain region.

Referring to FIG. 3B, dual-gate structure 40 includes a gate 41, a first gate finger 42, a second gate finger 43 and an active layer 14-1. Within active layer 14-1, two channel regions (not numbered) under first gate finger 41 and second gate finger 42 are formed. The two channel regions divide active layer 14-1 into three regions, a first diffused region 44, for example, a source region, a second diffused region 48, for example, a drain region, and a third region 46, i.e., an n+ region. Dual-gate structure 40 may exhibit better electrical properties than single-gate structure 30 shown in FIG. 3A because the mobility of carrier in dual-gate structure 40 is not adversely affected by the vertically extending grain boundary 22.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A method for fabricating a semiconductor device, comprising:
   providing a substrate;
   forming an amorphous silicon layer over the substrate;
   forming a heat retaining layer on the amorphous silicon layer;
   patterning the heat retaining layer; and
   irradiating a portion of the amorphous silicon layer underlying the heat retaining layer to control a grain growth on a portion of the amorphous silicon layer underlying the heat retaining layer.

2. The method of claim 1, further comprising forming a buffer layer on the substrate before forming the amorphous silicon layer.

3. The method of claim 1, further comprising forming the heat retaining layer with silicon oxynitride.

4. The method of claim 1, further comprising irradiating the patterned heat retaining layer with one of an excimer laser or a YAG laser.

5. The method of claim 1, further comprising irradiating the patterned heat retaining layer with an irradiation position overlap of approximately 1%.

6. The method of claim 1, further comprising removing portions of the amorphous silicon layer by using the patterned heat retaining layer as a mask.

7. The method of claim 6, further comprising:
   forming a first diffused region in the remaining amorphous silicon layer; and
   forming a second diffused region in the remaining amorphous silicon layer spaced apart from the first diffused region.

8. The method of claim 6, further comprising:
   forming a first diffused region in the remaining amorphous silicon layer;
   forming a second diffused region in the remaining amorphous silicon layer spaced apart from the first diffused region; and
   forming a third diffused region in the remaining amorphous silicon layer between and spaced apart from the first and second diffused regions.

9. The method of claim 1, further comprising determining an initial growth site on the amorphous silicon layer in patterning the heat retaining layer.

10. The method of claim 1, further comprising providing the substrate including one of a wafer, quartz, glass, plastic or metal foil.

11. A method for fabricating a semiconductor device, comprising:
    providing a substrate;
    forming a buffer layer on the substrate;
    forming an amorphous silicon layer on the buffer layer;
    forming a heat retaining layer on the amorphous silicon layer;
    patterning the heat retaining layer; and
    irradiating a portion of the amorphous silicon layer underlying the heat retaining layer with a laser to control a grain growth on a portion of the amorphous silicon layer underlying the heat retaining layer.

12. The method of claim 11, further comprising moving the laser with respect to the patterned heat retaining layer with an irradiation position overlap of approximately 1%.

13. The method of claim 11, further comprising forming the heat retaining layer with silicon oxynitride.

14. The method of claim 11, further comprising removing portions of the amorphous silicon layer by using the patterned heat retaining layer as a mask.

15. The method of claim 11, further comprising determining an initial growth site on the amorphous silicon layer in patterning the heat retaining layer.

* * * * *